(12) United States Patent
Ishizuka

(10) Patent No.: US 7,330,044 B2
(45) Date of Patent: Feb. 12, 2008

(54) METHOD AND APPARATUS FOR SEMICONDUCTOR TESTING

(75) Inventor: Koji Ishizuka, Tokyo (JP)

(73) Assignee: Agilent Technologies, Inc., Palo Alto, CA (US)

( * ) Notice: Subject to any disclaimer, the term of this patent is extended or adjusted under 35 U.S.C. 154(b) by 17 days.

(21) Appl. No.: 11/346,408

(22) Filed: Feb. 2, 2006

(65) Prior Publication Data

US 2006/0195726 A1    Aug. 31, 2006

(30) Foreign Application Priority Data

Feb. 25, 2005    (JP)    ............... 2005-050494

(51) Int. Cl.
*G01R 31/26* (2006.01)
(52) U.S. Cl. .................................. 324/765
(58) Field of Classification Search ............... 714/38; 324/765, 760, 158.1; 703/26; 702/123
See application file for complete search history.

(56) References Cited

U.S. PATENT DOCUMENTS 6,966,019 B2 *  11/2005  Viens et al. ............... 714/724

2002/0109734 A1 *  8/2002  Umezu et al. ............ 345/846
2003/0097233 A1 *  5/2003  Sutton et al. ............. 702/123

FOREIGN PATENT DOCUMENTS

JP    2000-088919    3/2000

* cited by examiner

*Primary Examiner*—Ha Tran Nguyen
*Assistant Examiner*—Tung X. Nguyen
(74) *Attorney, Agent, or Firm*—Marc Bobys

(57) ABSTRACT

A semiconductor testing system including an input; a display; multiple testing units; a memory in which is stored multiple applications that specify the operating procedure of the testing units and multiple categories that are related to the applications; and a controller that has the function of displaying the categories, displaying on the display the applications relating to the categories selected based on the input from the input, and conducting the applications that have been selected by the input from among the displayed applications and controlling the testing units, and the like.

4 Claims, 5 Drawing Sheets

(a)

(b)

# METHOD AND APPARATUS FOR SEMICONDUCTOR TESTING

FIELD OF THE INVENTION

The present invention relates to a semiconductor testing system and a method for controlling that system, and in particular, to a testing system comprising multiple testing units and multiple applications that specify the operating procedure of the testing units, as well as a method for controlling that system.

DISCUSSION OF THE BACKGROUND ART

Semiconductor testing systems comprise multiple testing units for generating input signals to the semiconductor device that is the device under test, and testing the output signals as well as controller for controlling these units and executing predetermined tests. A variety of tests can be executed by changing the connections with the device under test and the operating procedure, even when the same testing unit is used. For instance, when the FET of a device under test is to be tested using four testing units, an ammeter, a voltmeter, and two power sources, the properties of the gate voltage and the drain current of the FET can be tested by connecting the power sources between the gate and source and the drain and source, the voltmeter to the gate, and the ammeter to the drain. Moreover, it is possible to measure the ON resistance of an FET (properties of drain voltage and drain current) by moving the voltmeter from the gate to the drain. It is also possible to test the alternating-current characteristic of an FET by converting the signals applied from the power sources to alternating-current signals and changing the frequency.

Thus, the test units can respond to a variety of tests by changing the connection with the device under test. Controller for operating multiple testing units in cooperation with one another and performing the desired testing such as the technology cited in JP (Kokai) 2000-88,919 are needed in order to effectively use testing units for multiple tests. The controller often consists of information processing devices that execute the operating procedure of the testing units with software such that the testing procedure can be easily changed. In the present specification such software is referred to as applications. It is often the case that multiple applications are stored in the testing system.

The number of applications has increased dramatically and the functions of individual testing units have also increased as a result of the diversification of the types of device under test and the test items. Therefore, detailed knowledge and experience with testing systems is necessary if an operator is to select the applications appropriate for the object of a test from among the applications stored in the memory of a testing system and the functions of the testing units and set the parameters needed to execute the applications. Consequently, there is a need for a testing system with which simple, high-speed testing can be performed by an operator who is not familiar with the measurement system.

SUMMARY OF THE INVENTION

A semiconductor testing system comprising an input; a display; multiple testing units; a memory in which are stored multiple applications that specify the operating procedures of the testing units and multiple categories that are related to the applications; as well as a controller that has the function of displaying the categories, displaying on the display the applications relating to the categories selected based on the input from the input, and conducting the applications that have been selected by the input from among the displayed applications as well as controlling the testing units, and similar functions.

Alternatively, a semiconductor testing system comprising an input; a display; multiple testing units; a memory in which are stored multiple applications that specify the operating procedure of the testing units and parameter items that are related to the applications and are necessary for executing these applications; as well as a controller having the functions of displaying on the display the parameter items that are necessary for the execution of the applications selected by the input and executing the applications under the execution conditions that have been determined based on the parameters input by the input and controlling the testing unit.

Another embodiment includes a semiconductor testing system characterized in that it comprises an input; a display mean; multiple testing units; a memory in which are stored multiple applications that specify the operating procedures of the testing units; as well as a control device having (a) the function of executing the applications, (b) the function of storing in the memory a combination of the executed applications, either the parameters or the execution conditions or of both these, and some or all of the execution results of the applications, and (c) the function of displaying a list of the combinations on the display device.

The intended application can be selected from a list of applications related to a category; therefore, the operator can quickly and easily select the intended application. Moreover, the parameter items necessary for execution of an application are displayed; therefore, the operator can quickly and easily set the necessary parameters. Furthermore, a combination of the applications that have been executed, the parameters or the execution conditions, and the application results can be called up; therefore, the settings for conducting the same type of test can be arranged quickly and easily.

DETAILED DESCRIPTION OF THE PREFERRED EMBODIMENT

Figure 1:
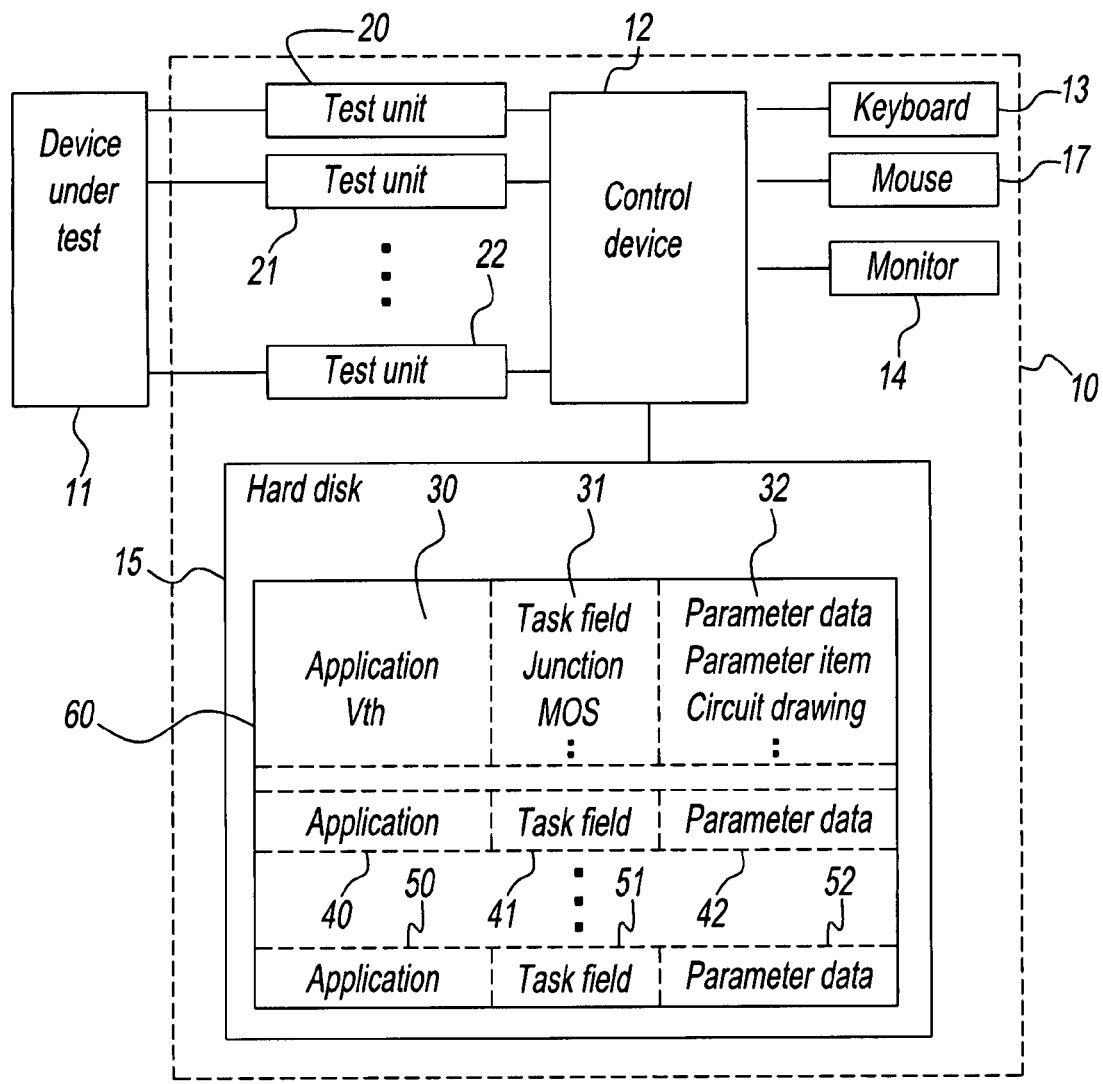
FIG. 1 is a drawing of the testing system of the working example of the present invention.

Working Examples of the present invention will now be described while referring to the drawings.

FIG. 1 is a schematic representation of a testing system 10 of the present invention. Testing system 10 comprises multiple testing units 20, 21, and 22, an input in the form of a keyboard 13 and a mouse 17, a display in the form of a monitor 14, a memory in the form of a hard disk 15, and a control device 12 connected to these components. Testing system 10 is connected to a device under test 11 at the time of the test.

Device under test 11 is a transistor, an integrated circuit, an optical sensor, a TFT array, or another semiconductor device. Control device 12 comprises an MPU, DSP, or other computer, and has the function of executing applications and controlling the operation of the testing system. Testing units 20, 21, and 22 comprise not only an ammeter, a voltmeter, or another measuring device, but also the devices necessary for setting device under test 11 to the test conditions, such devices as a signal generator, a standard power source, a temperature control device, and similar equipment. Moreover, testing system 10 of the present Specification comprises keyboard 13 and mouse 17 as the input, but the input is not limited to these and also can include switches, touch panels, touch pads, push buttons, turnable knobs, trackballs, and other pointing devices, as well as devices that receive control signals from the outside through a network, and similar devices. Similarly, the display is not limited to monitor 14 that is given in the working example, and can include lamps and devices that transmit the display details to an outside device through a network. In addition to hard disk 15 in the working examples, the memory can be a ROM, a RAM, a flash memory, or another memory, or one or a combination of the following: a flexible disk, a CD, a DVD, or another recording medium on which digital information can be recorded.

Of the above-mentioned structural elements, keyboard 13, mouse 17, and monitor 14 must be physically one unit or disposed close to one another, but it is not necessary for testing units 20, 21, and 22, control device 12, and hard disk 15 to be physically disposed close to one another and each of these components can be connected through a network.

A library 60 is stored in hard disk 15. Library 60 comprises, in association with one another, multiple applications 30, 40, and 50, list of major task fields of the application 31, 41, and 51, and parameter data 32, 42, and 53 necessary for execution. Applications 30, 40, and 50 can be software in which the operating procedure for testing units 20, 21, and 22 has been directly illustrated or the operating procedure can be illustrated while referring to other applications stored in hard disk 15.

Task fields 31, 41, and 51 are task fields belonging to the operator of the application, such as wiring, a junction FET, a MOS-FET, a TFT array, and the like. A task field is used as a category in the present working example such that the intended application can be quickly and easily selected, but the category is not limited to a task field and can be a technical field to which the device under test belongs or a business system belonging to the operator, and similar categories. Moreover, there can be multiple categories to which one application belongs. For instance, an application for testing the threshold voltage of an FET can belong to three task fields: a junction FET, a MOS-FET, and a TFT array. This is because the application in question is an application required by the operator belonging to any of the task fields.

The parameter items necessary for executing applications, default values for the parameters for applications 30, 40, and 50, and the execution conditions for the applications, such as the circuit diagram data for the test circuit displayed on monitor 14, are stored in parameter data 32, 42, and 52.

The above-mentioned parameter items will now be described briefly. When the operating conditions of the testing units were input by means of conventional testing systems, the operator set the operating conditions based on the structure of each testing unit, such as "the output voltage of testing unit 20." The operator had to understand the contents of the testing unit when such a method for setting conditions was used. Therefore, it was difficult for operators with little experience and operators without knowledge of the testing unit to set the parameters. By means of testing system 10 of the present invention, an operator can set the parameters without being concerned with the contents of the testing unit because the parameter items that are needed to execute an application are given based on the structure of the device under test, such as "gate voltage" or "drain voltage."

It should be noted that the parameter items include items related to parameters based on the above-mentioned structure of the device under test, as well as the name of the testing unit connected to the device under test and the parameters relating to the testing procedure, such as the number of times a test is repeated.

Figure 2:
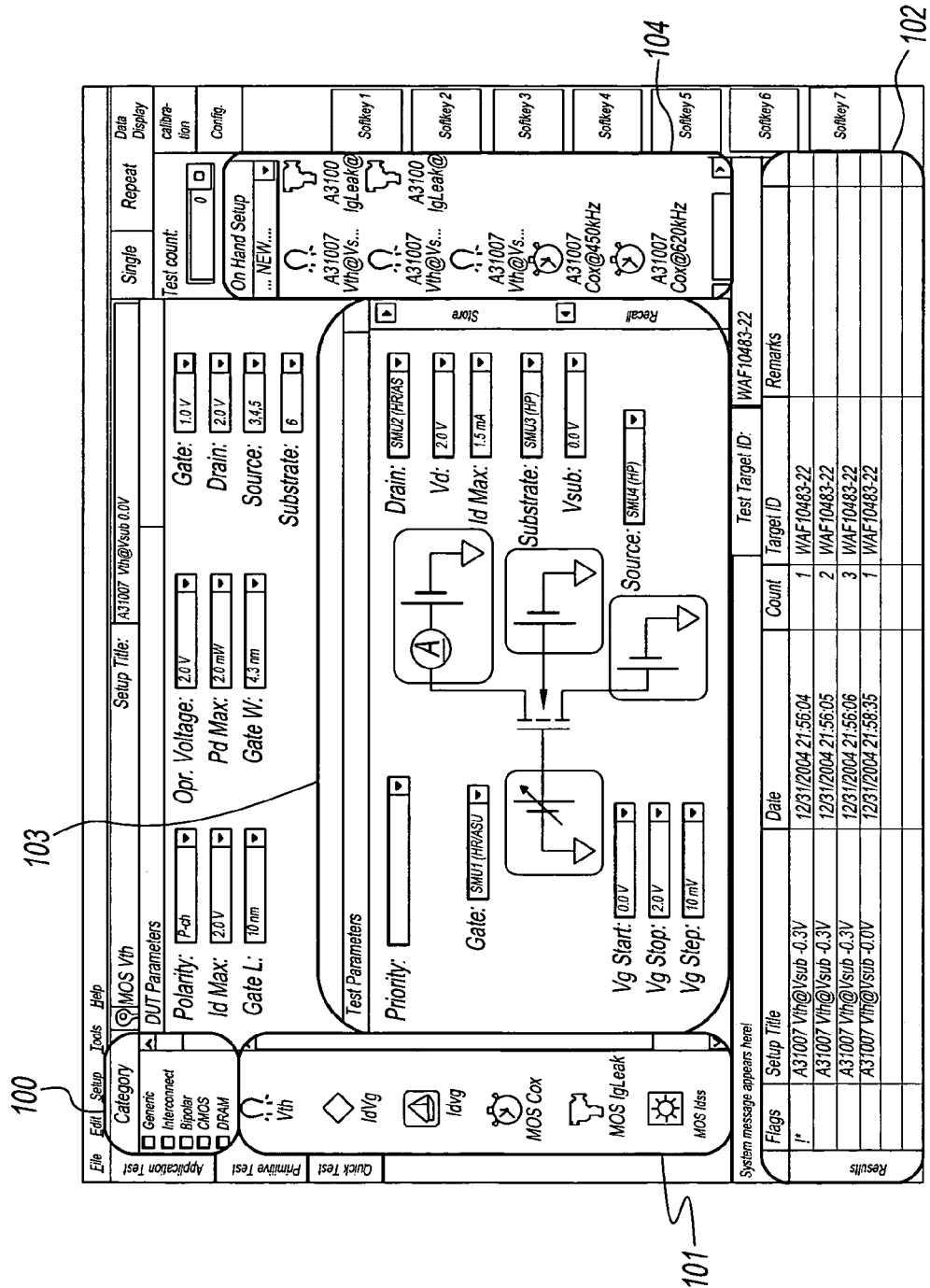
FIG. 2 is the monitor screen of the testing system of the working example of the present invention.
Figure 3:
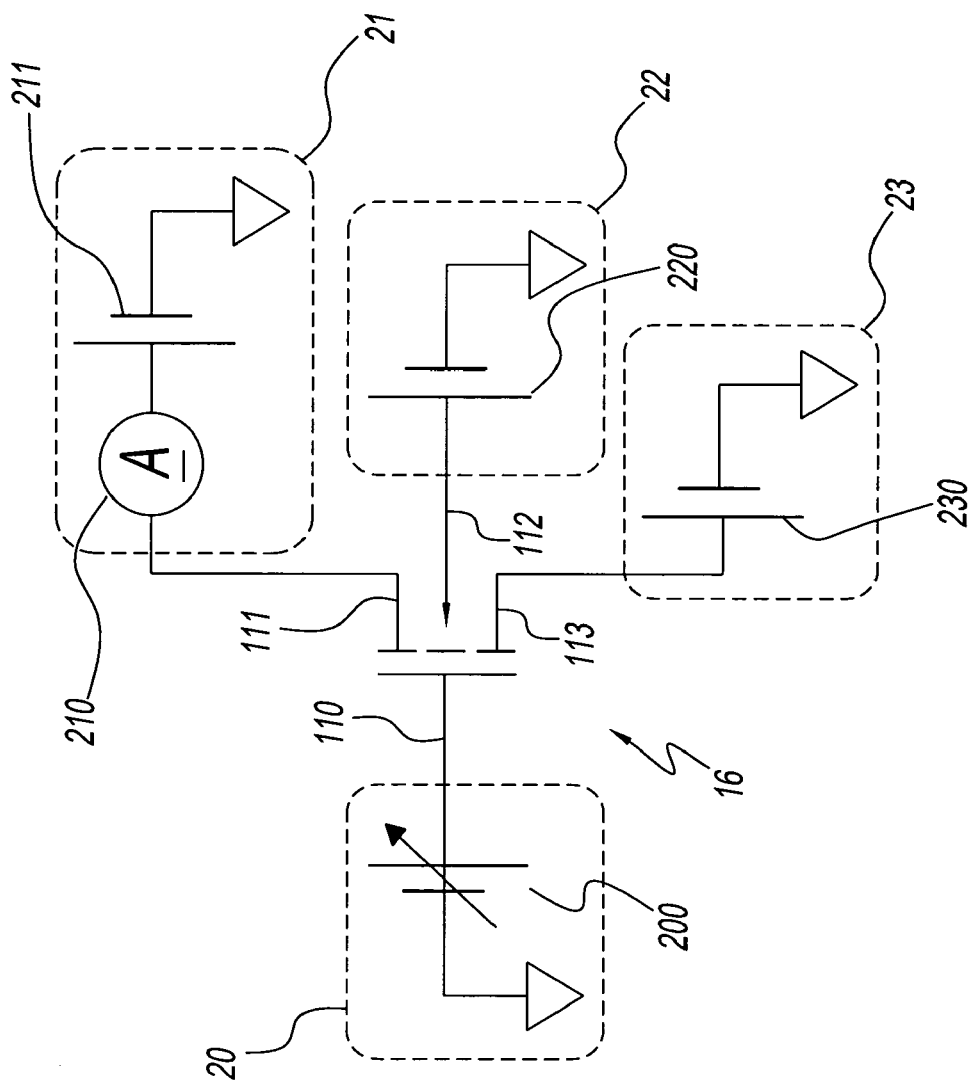
FIG. 3 is a connection diagram of the device under test and the testing unit in the working example of the present invention.
Figure 4:
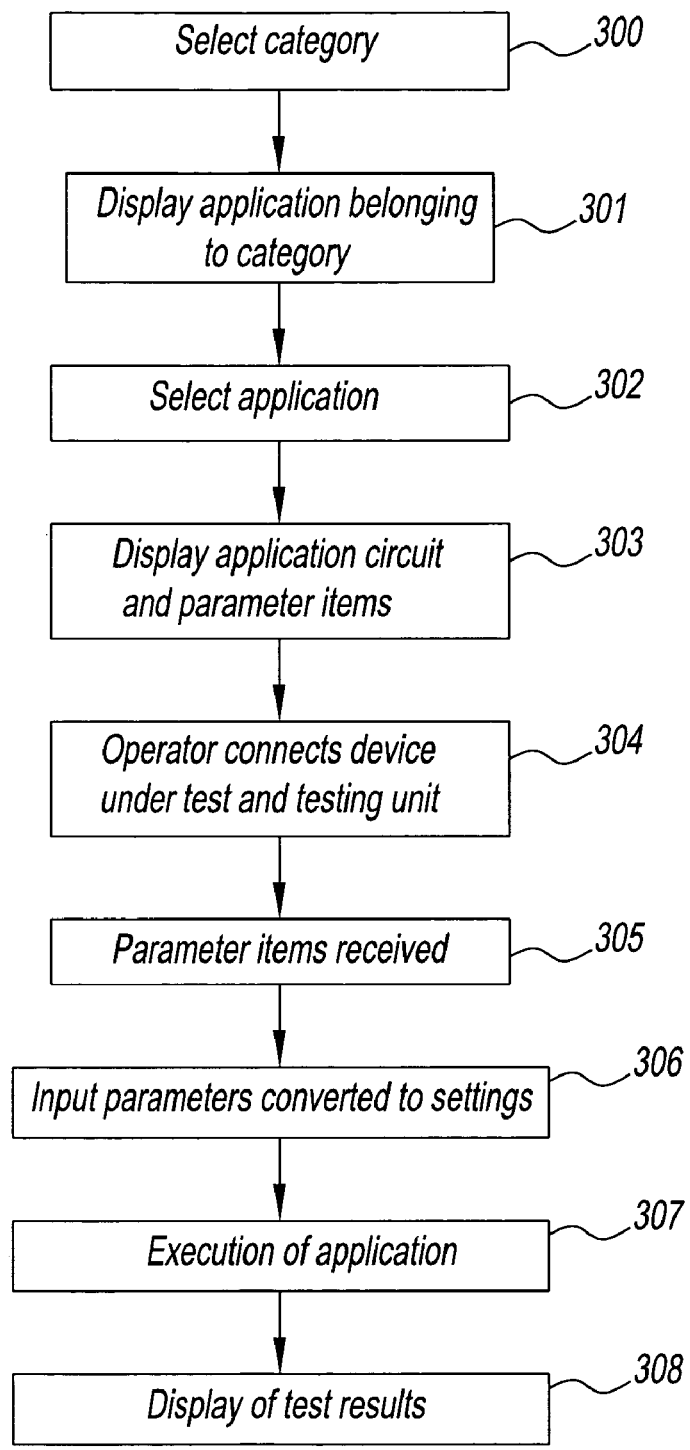
FIG. 4 is an operation flow chart for the testing system of the working example of the present invention.

The operation of testing system 10 will now be described while referring to the drawings, using as an example the measurement of the threshold voltage of a CMOS-FET. FIG. 2 is the display screen of monitor 14, FIG. 3 is the connection of a FET 16, or device under test 11, and testing units 20, 21, 22, and 23, and FIG. 4 is the operation flow chart of testing system 10.

First, the operator uses mouse 17 to click CMOS from the categories displayed on a category selection area 100. As a result, control device 12 selects the CMOS category (step 300), the filtering operation of task fields 31, 41, and 51 stored in library 60 is performed, and the applications belonging to the selected technical fields are singled out. The selected applications are displayed by a list of applications in an application selection area 101 of monitor 14 (step 301). Next, the operator uses mouse 17 to click the intended application Threshold Voltage Test Measurement (Vth) from application selection area 101. As a result, control device 12 selects the application for threshold voltage measurement (step 302), the corresponding parameter data 32 are read from library 60, and the connection circuit diagram and parameter items are displayed in a parameter setting area 103 (step 303). The operator connects FET 16 and test units 20, 21, 22, and 23 while referring to the displayed circuit diagram (step 304).

It should be noted that whether the application is intended only for operators with sufficient knowledge and experience or the application is one created by the operator himself, it is possible to display only a list for the parameter items needed to execute the application without displaying the circuit diagram in parameter display area 103. Moreover, if parameters that are used to execute an application and parameters used with high frequency are known in advance, the operator can quickly and easily set the parameters by storing the default values for each parameter in question in the parameter data and displaying the parameters in question together with the parameter items.

Figure 5:
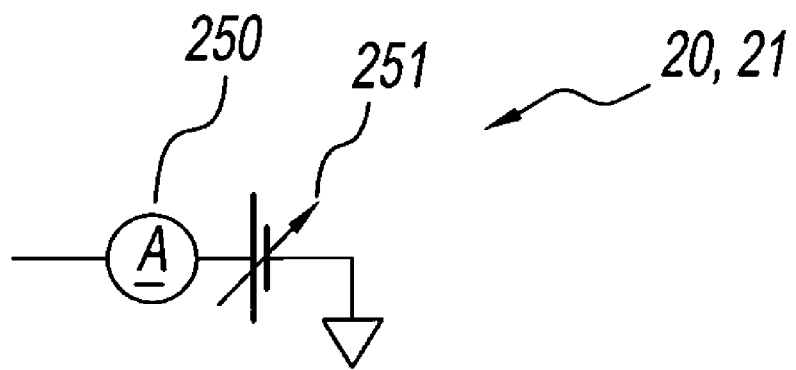
FIG. 5 is a diagram of the testing unit of the testing system of the working example of the present invention.
Figure 5:
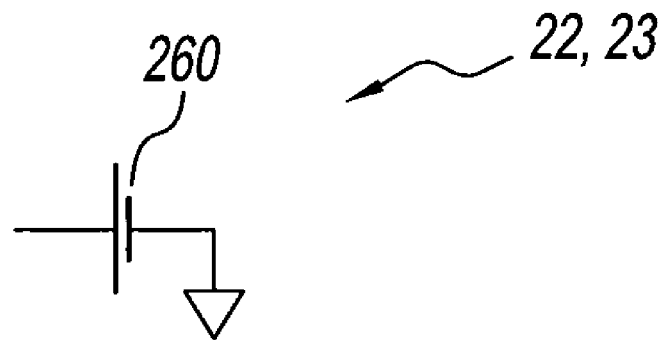

The connection of FET 16 and testing units 20, 21, 22, and 23 in the present working example will be described while referring to FIGS. 3 and 5. Testing system 10 has two each of the two types of testing units shown in FIGS. 5(a) and (b). Testing units 20 and 21 are in-series connections of an ammeter 250 and a variable voltage source 251, with one end grounded. Testing units 22 and 23 comprise a constant-voltage source 260 where one end is grounded.

By means of the test in the present working example (measurement of threshold voltage of FET 16), testing unit 20 is connected to a gate terminal 110 of FET 16, testing unit 21 is connected to a drain terminal 111, testing unit 22 is connected to a substrate terminal 112, and testing unit 23 is connected to a source electrode 113.

Testing unit 20 has ammeter 250 and variable voltage source 251, but the only function necessary to execute application 30 is the function as a variable voltage source 200. Therefore, this unit is represented as a variable voltage source in the circuit diagram of parameter setting area 103. Moreover, the parameter items are displayed only by the name of the unit to which gate terminal 110 is connected and parameter items of the variable voltage source (start voltage, end voltage, amount of change in voltage). As described above, the parameter items are given based on the structure of the device under test 11, such as the starting gate voltage "Vg start," end gate voltage "Vg stop," and the like, and are not given based on the structure of testing unit 20, such as "starting voltage of testing unit 20," or "end voltage of testing unit 20."

Similarly, testing unit 21 also has an ammeter 250 and a variable voltage source 251, but the functions needed to execute application 30 are an ammeter 210 and a constant-voltage power source 211; therefore, they are displayed as the ammeter and the constant-current power source in the circuit diagram of parameter setting area 103. Moreover, the name of the unit to which drain terminal 111 is connected and the parameter items of the constant-voltage power source (voltage, maximum current) are the only items displayed under the parameter items. The parameter items are given as the name of the testing unit connected to the terminal "drain," and "Vd," and "Id Max" based on the structure of FET 16 or the device under test 11.

Units 22 and 23 connected to substrate terminal 112 and source terminal 113 use the unaltered function of the unit as constant-voltage power source 260. The parameter items are given as the name of the units connected to each terminal, or "Substrate" and "Source," and "Vsub" based on the structure of FET 16, or device under test 11.

It should be noted that the voltage applied to the source terminal is not given as a parameter item because a fixed value is set by application 30. Thus, the values for setting parameters that can be predetermined are pre-set as constants within an application and are blocked from the user; therefore, the user can quickly set the necessary parameters without worrying about setting these pre-set parameters.

We will now return to the description of the operation of testing system 10. The operator uses keyboard 13 to input the necessary parameters in accordance with the parameter items displayed on monitor 14 once the connection of FET 16 and testing units 20, 21, 22, and 23 has been completed (step 304). Control device 12 receives the parameters from keyboard 13 (step 305), the parameters are transferred to application 30, and application 30 is executed.

When application 30 is executed, control device 12 converts the parameters that have been transferred to settings inside the testing units by a pre-determined conversion formula (step 306). For instance, in the case of testing unit 20, the setting applied to the DA converter inside testing unit 20 is set at 0 and the resolution (voltage corresponding to one step of the DA converter) is set at 10 mV in order to obtain a voltage of 0 V; therefore, the input parameters (starting voltage of 0 V, end voltage of 2 V, and the amount of change in voltage of 10 mV) are converted to settings (starting voltage of 0, end voltage of 200, amount of change in voltage of 1). When the parameters and the settings are the same, conversion is not particularly necessary and the input parameters are therefore processed as settings. It should be noted that the physical amounts and other values input by the operator are referred to as "parameters" and the internal settings or the converted internal settings of the testing units and the execution conditions of the applications are referred to as "settings" in the present application.

Next, control device 12 begins testing FET 16 (step 307). Control device 12 first transmits the settings to testing units 20, 21, 22, and 23 in accordance with application 30 and sets the conditions to the initial conditions for measurement. Then the gate voltage of unit 20 is increased in increments of 10 mV and the current flowing to the drain electrode is measured by ammeter 210 of unit 21. When the measurement of the gate voltage-drain current properties is completed, control device 12 displays a graph of the gate voltage-drain current properties and analyzes the test results and finds and displays the threshold voltage (step 308) in accordance with application 30.

The test results are automatically stored in hard disk 15 in connection with the combination (setup) of the application name and parameter and this list is displayed in data area 102. Thus, the operator does not need to store files by hand and efficient testing is possible. Thus, the "name" of the application means information that can differentiate one application from another, such as an application file name or the identification number given to an application. The stored test results can be called up and selected from a list.

Moreover, testing system 10 can also limit the list displayed in data area 102 to only the test results associated with a predetermined application name. Furthermore, it is also possible to store the test results in hard disk 15 in connection with the time when the test was conducted or the records of comments on the device under test and display only the test results associated with a predetermined test time or a predetermined device under test in the list displayed in data area 102. As a result, the operator can more easily manage large volumes of test results and analyze comparative tests, and the like.

Furthermore, by means of testing system 10, the input parameters can be stored in hard disk 15 in combination with the application name. The list of the combinations of stored application names and parameters is displayed in an on-hand setup area 104 of monitor 14. The user can call up the intended combination of applications and parameters with one operation by selecting the combination from the list. Thus, when tests are performed a number of times with the same parameters, the procedure of setting the parameters for each test is omitted and testing can be performed rapidly.

The operating procedure for executing the above-mentioned control using control device 12 is written in the program as with applications of testing units 20, 21, 22, and 23. The program specifying the control method is stored in hard disk 15, which is the memory.

The technical concept of the present invention has been described in detail while referring to specific working examples, but it is clear that the details can be modified and revised by persons skilled in the art of the present invention as long as the changes do not deviate from the essential points and scope of the claims.

What is claimed is:

1. A semiconductor testing system comprising:
   an input device,
   a display,
   multiple testing units,
   a memory in which are stored multiple applications that specify operating procedures of the multiple testing units, and for each of the multiple applications a task field that indicates a category, and
   a controller that:
   (a) selects one or more categories based on a first input signal from the input device;
   (b) selects, from the multiple applications, one or more applications whose task field corresponds to the one or more selected categories, and displays the selected one or more applications on the display;
(c) selects, from the displayed one or more applications, an application to be executed, based on a second input from the input device; and
(d) executes the application selected in step (c).

2. A semiconductor testing system comprising:
an input device,
a display,
multiple testing units,
a memory in which is stored multiple applications that specify operating procedures of the multiple testing units, and for each of the multiple applications, a task field that indicates a category, and
a controller that:
(a) selects an application to be executed from among the multiple applications based on an input signal from the input device, and the category indicated by the task field of the selected application;
(b) determines the execution conditions of the selected application based on parameters that have been input from the input device;
(c) executes the selected application;
(d) stores in the memory a combination of either the parameters or the execution conditions or both of these, which is input by step (b), some or all of the results of executing the application in step (c), and the name of the application selected in step (a); and
(e) displays a list of said combinations on the display device.

3. The system according to claim 2, wherein step (e) is followed by:
(f) evaluates whether or not some or all of the combinations coincide with predetermined conditions; and
(g) displays only the list of combinations that coincide on the display device.

4. A semiconductor testing system comprising:
an input device,
a display,
multiple testing units,
a memory in which is stored multiple applications that specify operating procedures of the multiple testing units, and for each of the multiple applications, a task field that indicates a category; and
a controller that:
(a) displays on the display, applications from the multiple applications, whose task field corresponds to categories that have been selected based on an input signal from the input device, and
(b) executes an application selected by the input from among the displayed applications.

* * * * *